United States Patent
Guillot

(10) Patent No.: US 10,038,474 B2
(45) Date of Patent: Jul. 31, 2018

(54) POWER/DATA ELECTRICAL COUPLER

(71) Applicant: SAFRAN ELECTRONICS & DEFENSE SAS, Boulogne Billancourt (FR)

(72) Inventor: François Guillot, Boulogne Billancourt (FR)

(73) Assignee: SAFRAN ELECTRONICS & DEFENSE SAS, Boulogne Billancourt (FR)

( * ) Notice: Subject to any disclaimer, the term of this patent is extended or adjusted under 35 U.S.C. 154(b) by 0 days.

(21) Appl. No.: 15/555,366

(22) PCT Filed: Mar. 22, 2016

(86) PCT No.: PCT/EP2016/056272
§ 371 (c)(1),
(2) Date: Sep. 1, 2017

(87) PCT Pub. No.: WO2016/150970
PCT Pub. Date: Sep. 29, 2016

(65) Prior Publication Data
US 2018/0041250 A1    Feb. 8, 2018

(30) Foreign Application Priority Data

Mar. 25, 2015  (FR) .................................. 15 52498

(51) Int. Cl.
*H04B 3/56* (2006.01)
*H01F 38/14* (2006.01)
(Continued)

(52) U.S. Cl.
CPC ............... *H04B 3/56* (2013.01); *H01F 38/14* (2013.01); *H03H 7/0138* (2013.01);
(Continued)

(58) Field of Classification Search
CPC .......... H04B 3/56; H04B 3/542; H04B 15/04; H04B 2203/5491; H04B 2215/064;
(Continued)

(56) References Cited

U.S. PATENT DOCUMENTS 5,541,957 A * 7/1996 Lau .................. H04L 12/40136
375/257
2010/0264727 A1  10/2010 Riedel et al.
2015/0109073 A1   4/2015 Guillot et al.

FOREIGN PATENT DOCUMENTS

| CA | 2 699 584 A1 | 8/2009 |
| FR | 2 937 199 A1 | 4/2010 |
| FR | 2 993 106 A1 | 1/2014 |

OTHER PUBLICATIONS

May 13, 2016 Search Report issued in International Patent Application No. PCT/EP2016/056272.

* cited by examiner

*Primary Examiner* — Kabir A Timory
(74) *Attorney, Agent, or Firm* — Oliff PLC; R. Brian Drozd

(57) ABSTRACT

A power/data electrical coupler, designed to send over a two-wire bus or to receive therefrom data signals and to deliver to said two-wire bus or receive therefrom a power-supply potential. Such a coupler includes a transformer, a first winding of which and a second and third winding of which are connected in series with each other with a common terminal connected to a power supply line and the other two terminals to a two-wire bus. It also includes a second isolation transformer connected between said first transformer and said two-wire bus. According to the invention, said terminal common to said second and third windings is connected to said power supply line by means of a band-rejection filter rejecting one or more of the frequency (Continued)

bands including the resonant frequency or frequencies resulting from the association of the isolation transformer and the transformer.

6 Claims, 6 Drawing Sheets

(51) Int. Cl.
*H04B 3/54* (2006.01)
*H04L 25/02* (2006.01)
*H03H 7/01* (2006.01)

(52) U.S. Cl.
CPC .......... *H04B 3/542* (2013.01); *H04L 25/0266* (2013.01); *H04B 2203/5416* (2013.01); *H04B 2203/5429* (2013.01)

(58) Field of Classification Search
CPC ...... H04B 2215/067; H04B 2203/5408; H04B 2203/5445; H01F 38/14
See application file for complete search history.

POWER/DATA ELECTRICAL COUPLER

The present invention relates to a power/data electrical coupler. Such an electrical coupler is designed to send, over a two-wire bus, data signals delivered by a control unit or to receive data signals from said two-wire bus and deliver them to a control unit. Provision is also made for delivering a supply potential to said two-wire bus or to receive a supply potential from said two-wire bus. Such a power/data coupler is for example used for coupling, via two-wire buses, electrical actuators to control units and to power supplies by forming a data and power-supply transport network. Such networks are for example installed on aircraft.

As will be understood hereinafter, when they are grouped together in pairs, electrical couplers according to the invention form what is called a coupling system.

Various embodiments of such power/data electrical couplers are known and reference can be made, by way of examples, to those that are described in the patent publications CA 2699584, FR 2993106 and FR 2937199. Another equivalent embodiment is described in relation to FIG. 1 in order better to present the problem that the present invention seeks to solve.

Figure 1:
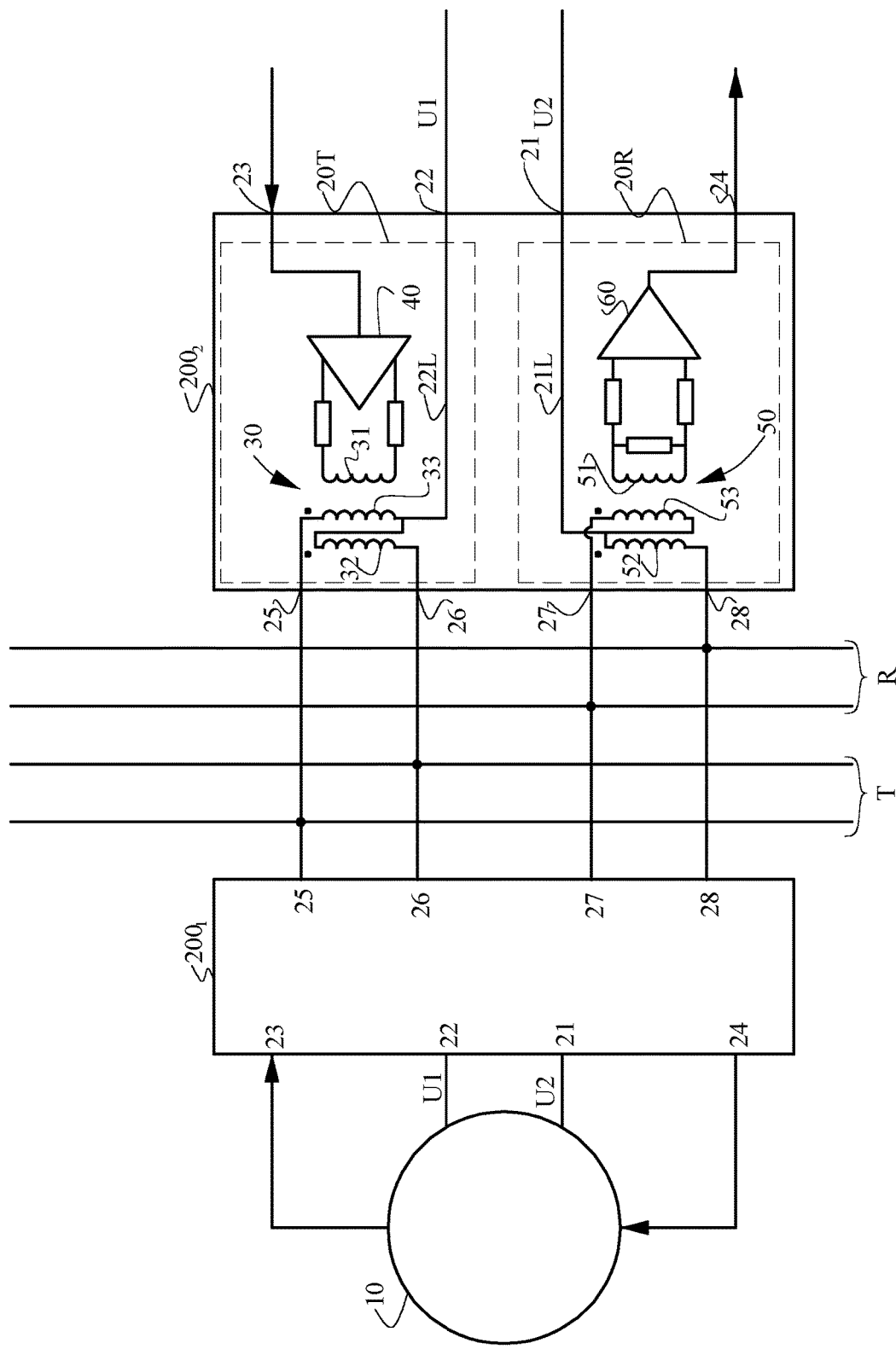

FIG. 1 shows a part of such a data and power-supply transport network, which comprises an actuator 10 and two coupling systems $200_1$ and $200_2$. The actuator 10 is connected to the system $200_1$, firstly in order to be supplied thereon with power by pins 21 and 22 respectively at first and second potentials U1 and U2 and, secondly, to send data over the network via the pin 23, or to receive data from the network via the pin 24. Likewise, the coupling system $200_2$ comprises pins 21 and 22, either to supply an actuator (not shown) connected to said pins 21 and 22, or raised to first and second supply potentials U1 and U2 from a supply source (not shown). It also comprises pins 23 and 24 for respectively receiving and sending data signals, for example from a peripheral such as an actuator or a control unit such as a computer. The coupling systems $200_1$ and $200_2$ are connected, via their respective pins 25, 26, 27 and 28, to two pairs of wires T and R for the respective transport of the data signals that are sent by an actuator or a control unit and data signals that are intended for the actuators or control units of the network. Other electrical coupling systems than those shown may be connected to the wires T and R for other actuators or control units, these pairs of wires T and R each then forming a two-wire bus. In addition, each wire in a pair of wires T, R is at a supply potential U1; U2 and thus transports the supply current coming from a supply source to the actuators. As will be seen hereinafter, whereas the data are transported on the two-wire buses T and R in differential mode, the supply current is transported in common mode.

In FIG. 1, the structure of the coupling system $200_2$ is detailed. It comprises two electrical couplers 20T and 20R. The electrical coupler 20T is dedicated to the sending of data signals over the two-wire bus T. To do this, it is connected to said two-wire bus T in order to send thereon the data signals that are delivered by a control unit (not shown) connected to the pin 23. Moreover, the supply potential U1 on the pin 23 is that of each of the wires of the two-wire bus T. The second coupler 20R is dedicated to the reception of data signals present on the two-wire bus R. To do this, it is connected to said two-wire bus R in order to receive thereon its data signals and to deliver them to a control unit (not shown) connected to the pin 24. Moreover, the supply potential U2 on the pin 21 is that of each of the wires of said two-wire bus R.

The electrical coupler 20T comprises a first transformer 30, the terminals of a winding 31 of which are connected, via respective impedance-matching resistors, to two outputs of an amplifier 40 receiving at its input the data signal present on the pin 23. This winding 31 creates a magnetic flux that excites two other identical windings 32 and 33 of the transformer 30. These windings 32 and 33 are connected in series together with a common terminal and two other terminals connected to the pins 23 and 26 and thus to the pair of wires T. They are wound so that they receive the same magnetic flux from the winding 31 and deliver the same signal to their terminals (see the representation for this purpose by symbolic dots). The common terminal of the two windings 32 and 33 is connected to the pin 22 of the coupler 20T by a power supply line 22L in order to receive or deliver thereon, according to the method of use of the electrical coupler in question, a supply potential U1.

Likewise, the electrical coupler 20R also comprises a second transformer 50, two identical windings 52 and 53 of which are connected in series together with a common terminal and two other terminals connected to the pins 27 and 28 and thus to the pair of wires R. It comprises a third winding 51, the terminals of which are connected via impedance-matching resistors to inputs of an amplifier 60, the output of which is connected to the pin 24 of the electrical coupler 20R in order to deliver data to a peripheral. The windings 52 and 53 are wound so that their respective magnetic fluxes are added in order to excite the winding 51 (see the symbolic dots for this purpose). The common terminal of the two windings 52 and 53 is connected to the pin 21 of the coupler by a power supply line 21L in order to receive or deliver thereon, according to the use made of the coupler, a supply potential U2.

When a supply source is connected to the pins 21 and 22, the potential U1 is found, via each of the windings 32 and 33, on each of the wires of the pair of wires T and the potential U2 for its part is found, via each of the windings 52 and 53, on each of the wires of the pair of wires R. Conversely, when an actuator is connected to the pins 21 and 22, the potential U1 present on each of the wires of the pair T is found at the common point of the windings 32 and 33 and therefore on the power supply line 22L, and the pin 22 and the potential U2 present on each of the wires of the pair R is found at the common point of the windings 52 and 53 and therefore on the power supply line 22L and the pin 21. This is the common mode.

The data signals present on the pin 23, after amplification by the amplifier 40, excite the winding 31, which generates a magnetic flux that is captured by the windings 32 and 33, which, on the respective wires of the pair of wires T, generate data signals of opposite amplitudes. Likewise, the data signals of opposite amplitudes respectively present on the wires of the pair of wires R generate magnetic fluxes, the absolute amplitudes of which are added in the windings 52 and 53, then exciting the winding 51, which then generates a differential data signal which, after amplification by the amplifier 60, is supplied to the pin 24 for a peripheral. This is then the differential mode.

Thus the data are transported on the pairs of wires R and T in differential mode whereas the supply current, in one direction or the other, is for its part transported in common mode.

The voltage is generated by the difference between the supply potentials U1 and U2 and, constituting the supply to the actuators, may be direct or alternating at relatively low frequency (for example less than 1 MHz) whereas the data transmission frequency may be higher (for example a few hundreds of MHz, for a transmission of the Ethernet type).

It should be noted that a particular coupling system may comprise only one electrical coupler, which will then be dedicated either to the sending of data signals over the two-wire bus T, or for the reception of data signals present on the two-wire bus R.

This particular structure of each electrical coupler, such as the electrical couplers 20R and 20T in FIG. 1, may pose problems when stray high-frequency currents flow on the two-wire buses T or R. This may be the case in the event of lightning striking the aircraft in which the network comprising the coupling system including said electrical couplers in question and buses R and T is installed, or during high-frequency tests such as those that are recommended by the standard DO-160. These high-frequency currents are found on the power supply lines 22L and 21L and may damage the supply source or the peripheral that is connected to the pins 21 and 22 of the coupling system $200_2$. They may also damage the amplifiers 40 and 60.

Figure 2:
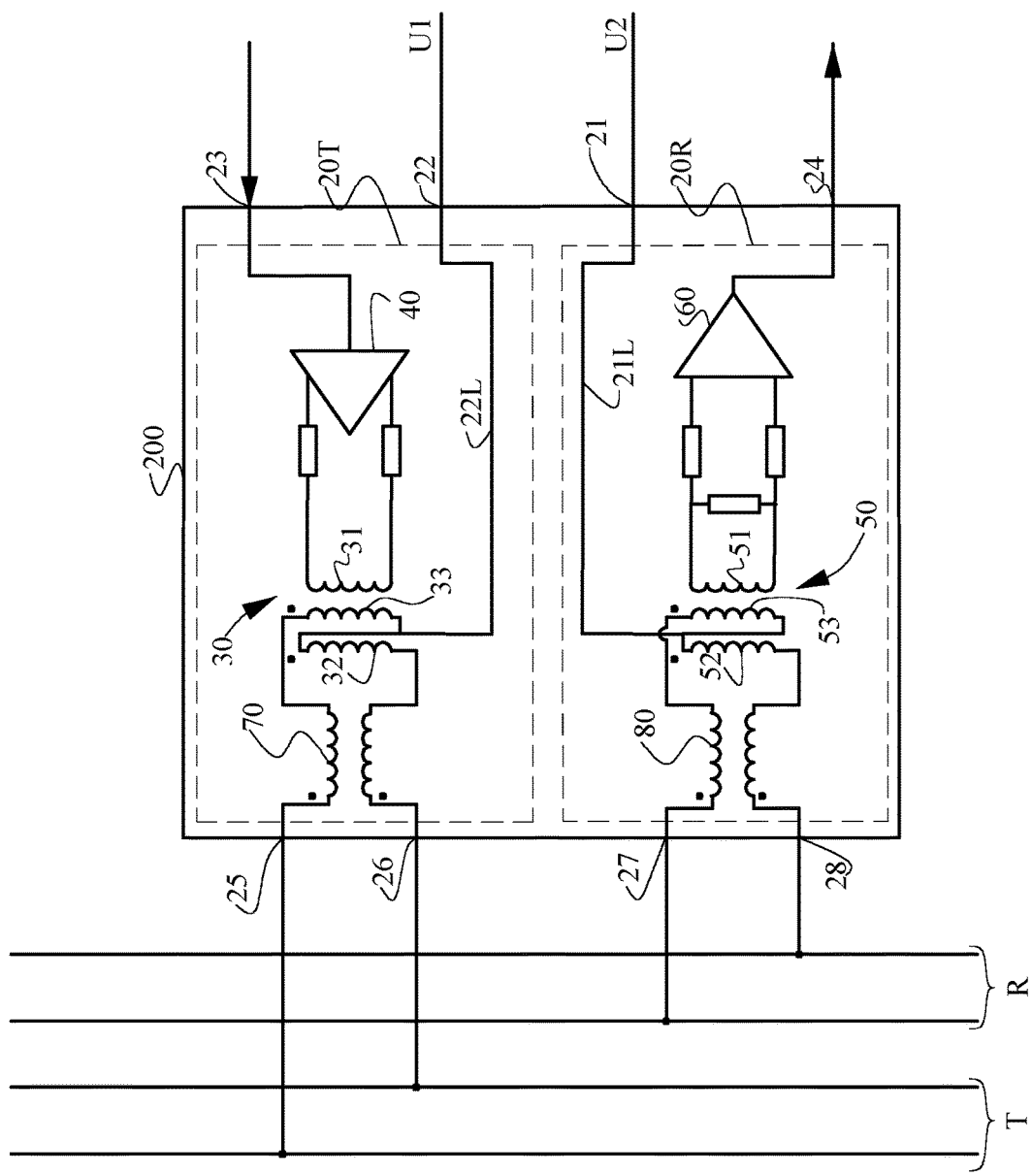

Another embodiment of the prior art is shown in FIG. 2. The same elements as those in FIG. 1 bear the same reference. For the pathway corresponding to the two-wire bus T, the electrical coupler 20T of the coupling system 200 shown comprises, in addition to the elements already present in FIG. 1, an isolation transformer 70 consisting of two identical windings coupled magnetically, the input terminals of which (marked by a dot) are connected to the pins 25 and 26 of the coupling system 200 intended to be connected to the two-wire bus T and the output terminals of which are respectively connected to the terminals of the windings 32 and 33 of the transformer 30. The signals transmitted by this transformer 70 in common mode are highly attenuated whereas in differential mode they are not. The high-frequency data signals are transmitted in differential mode (their potentials on the wires of the bus T are different) and are therefore not disturbed by the transformer 70. On the other hand, the high-frequency stray signals are transmitted in common mode (their potentials on the wires of the bus T are substantially equal) so that they are highly attenuated at the terminals of the windings 32 and 33 of the transformer 30.

Likewise, for the pathway corresponding to the pair of wires R, the electrical coupler 20R in FIG. 2 comprises an isolation transformer 80 with a structure and functioning identical to those of the isolation transformer 70.

Though this solution turns out to generally give complete satisfaction, it does not solve the problems mentioned above for certain frequencies. The aim of the invention is to solve these problems by proposing an improvement to the electrical coupler in FIG. 2 that makes it possible to improve the security of the peripherals or supplies connected to this electrical coupler.

To do this, the present invention relates to a power/data electrical coupler of the type comprising:
  a transformer consisting of a first winding which is designed to receive or deliver data signals and second and third windings which are magnetically coupled to each other and said first winding and which are connected in series with each other with a common terminal connected to a power supply line,
  an isolation transformer consisting of two identical windings magnetically coupled to each other,
  first terminals of said respective windings of said isolation transformer being connected to the terminals of the second and third winding of said transformer and second terminals of said respective windings of said isolation transformer being connected to a two-wire bus.

The windings of said transformers are such that said electrical coupler delivers to said bus or receives from said bus, in differential mode, data signals and, in common mode, the supply potential of said power supply line.

According to one feature of the invention, said terminal common to said second and third windings is connected to said power supply line by means of a band-rejection filter rejecting one or more of the frequency bands including the resonant frequency or frequencies resulting from the association of the isolation transformer and the transformer.

According to another feature of the invention, a coupler according to the invention also comprises a low-pass filter between said rejection filter and said power supply line.

According to another feature of the invention, the transformer of an electrical coupler according to the invention comprises a fourth winding, the terminals of which are connected to the first terminals of two identical windings coupled magnetically and wound in directions different from another transformer, said two windings having their second terminals connected to a mechanical ground.

The present invention also relates to a coupling system that is characterised in that it comprises two electrical couplers as just described, the first of said electrical couplers being connected to a first two-wire bus in order to send thereon data delivered to said first coupler by a control unit and to raise it to or receive thereon a first supply potential, and the second of said couplers being connected to a second two-wire bus in order to receive data thereon and to raise it to or receive thereon a second supply potential, said data being delivered by said second coupler to a control unit.

According to another feature of the invention, a coupling system according to the invention comprises a galvanic isolation transformer, the primary winding of which is connected either to a peripheral in order to be supplied thereon, or to a supply source, and the winding of which is connected to the power supply lines of the respective electrical couplers.

Finally, the present invention also relates to a data and power-supply transport network designed, via two-wire buses, to couple electrical actuators to control units and to power supplies that comprise a plurality of electrical couplers as just described or a plurality of coupling systems as just described.

Figure 3:
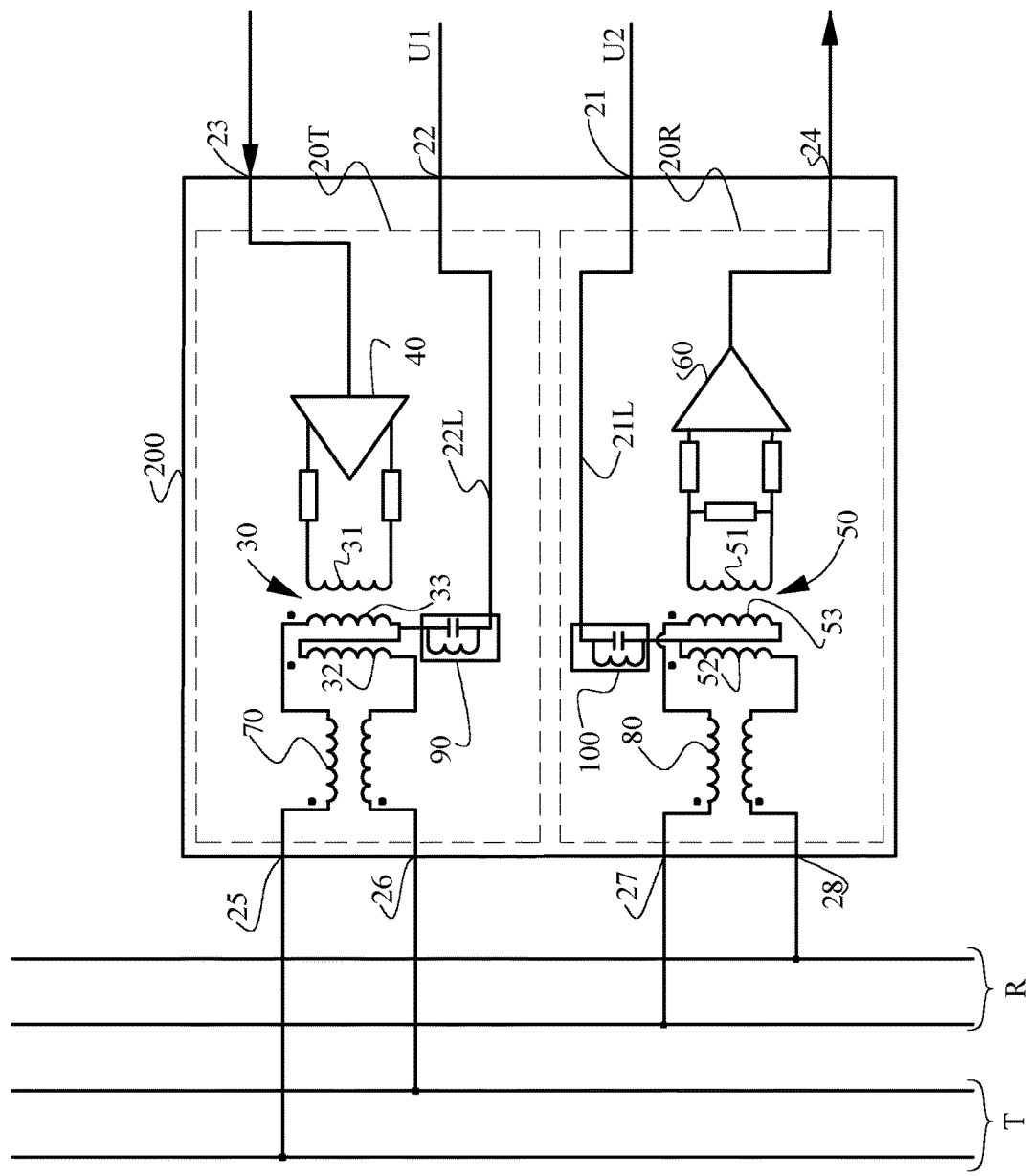
Figure 4:
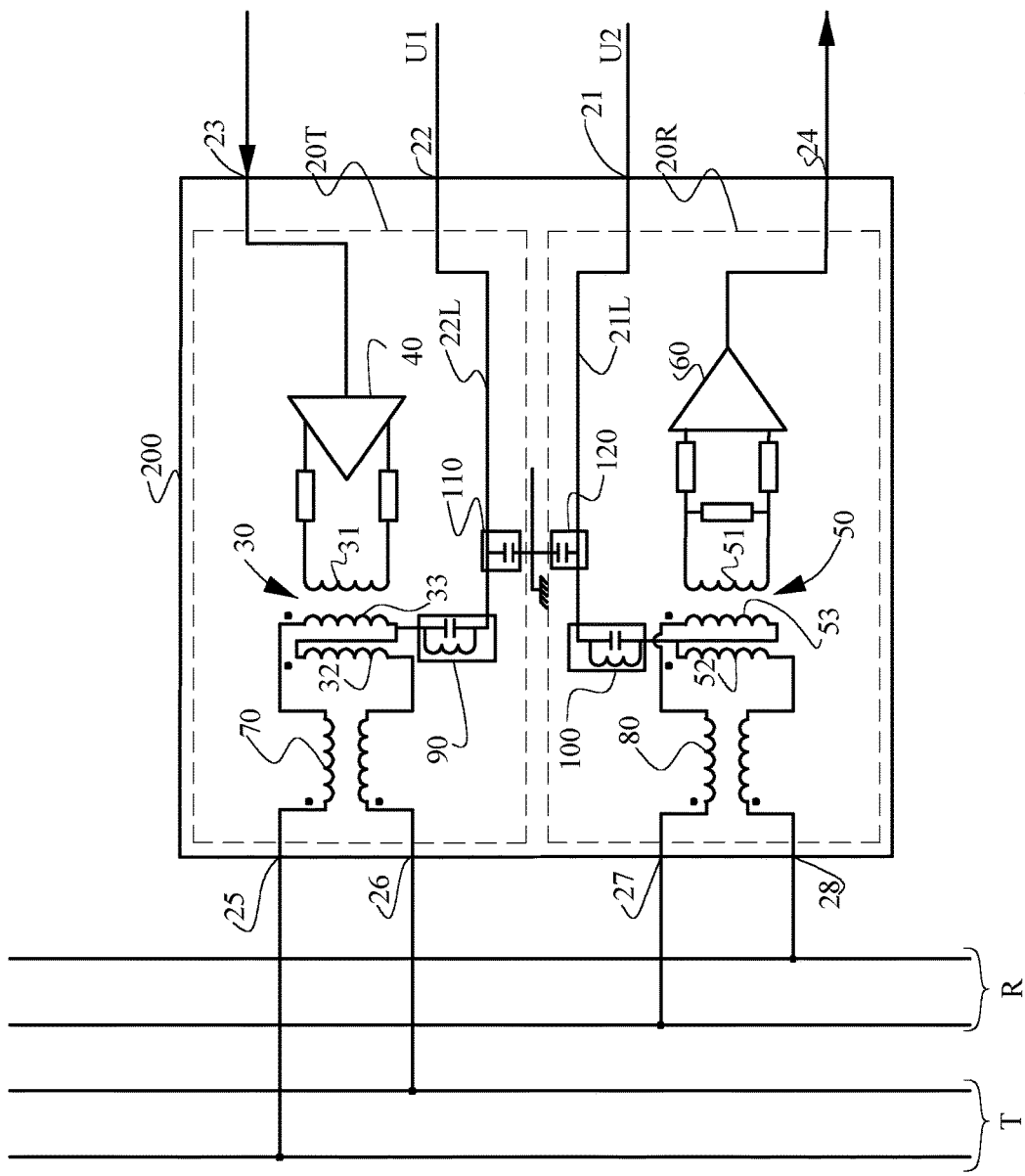
Figure 5:
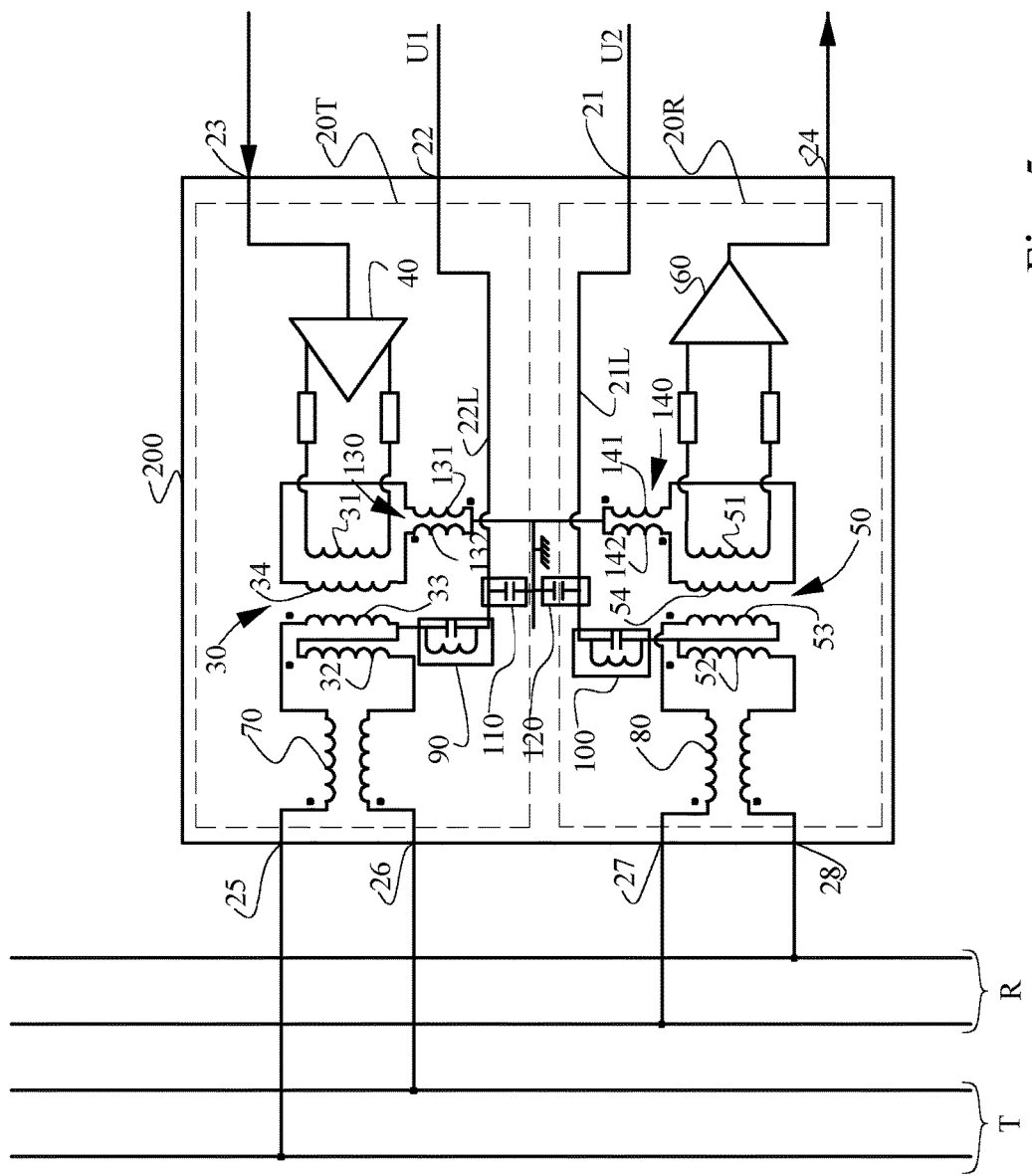
Figure 6:
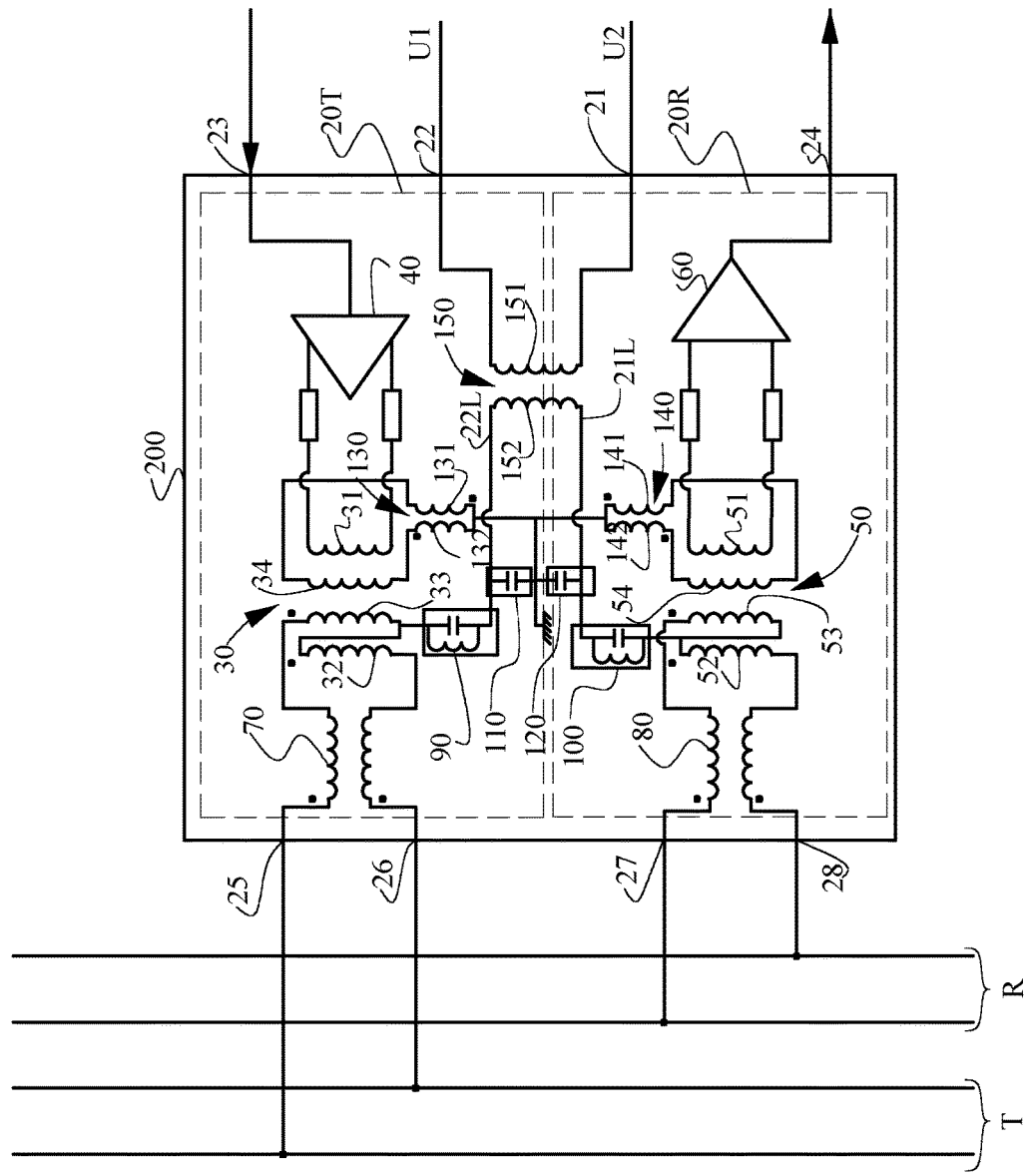

The features of the invention mentioned above, as well as others, will emerge more clearly from a reading of the following description of example embodiments, said description being given in relation to the accompanying drawings, among which:

FIG. 1 is a block diagram of a data and power-supply transport network that incorporates a coupling system provided with electrical couplers of the prior art, FIG. 2 is a block diagram of a coupling system including two electrical couplers according to an embodiment of the prior art, an improvement to the coupling system in FIG. 1, FIG. 3 is a block diagram of a coupling system including two electrical couplers according to a first embodiment of the present invention, FIG. 4 is a block diagram of a coupling system including two electrical couplers according to a second embodiment of the present invention, FIG. 5 is a block diagram of a coupling system including two electrical couplers according to a third embodiment of the present invention, and FIG. 6 is a block diagram of a coupling system including two electrical couplers according to a fourth embodiment of the present invention.

The invention starts from the finding that the high-frequency stray signals that are still present on the supply lines 22L and 21L of the respective electrical couplers 20T and 20R of FIG. 2 have substantially the same frequency F0 or the same frequencies F0 comprising a main frequency and secondary frequencies, such as harmonics or sub-harmonics of the main resonant frequency, and that the or each frequency F0 corresponds to the or a resonant frequency resulting from the association of the transformer 70 (or respectively 80) and the transformer 30 (or respectively 50). This is because, to simplify, at high frequency and in common mode, the transformer 70 (or 80) is equivalent to an inductor. At high frequency, the transformer 30 (or 50), at the terminals of the windings 32 and 33 (52 and 53), has a not insignificant capacitive component. This inductor and capacitive component form together a resonant circuit (wave trap) with a resonant frequency F0.

It should be noted that the or each resonant frequency F0 can be determined experimentally by supplying the transformer 70 in common mode (same signal on the pins 25 and 26) and by measuring the amplitude of the signal on the common terminal of the windings 32 and 33 of the transformer 30, and this according to the frequency. At the main resonant frequency, this amplitude is maximum. Amplitude maxima may also be present for secondary frequencies, such as harmonics or sub-harmonics of the main resonant frequency F0. It may also be determined by calculation having regard to the physical characteristics constituting the transformers 30 and 70 (or respectively 50 and 80). Finally, it may also be determined by simulation by means of a suitable simulator.

A coupling system according to the present invention is intended to be implemented in the same way as the coupling systems 200₁ and 200₂ in FIG. 1. Thus a coupling system 200 according to a first embodiment of the present invention shown in FIG. 3 comprises the same pins as the coupling systems 200₁ and 200₂ in FIGS. 1 and 2, in particular pins 25 and 26 for sending data to a two-wire bus T of the network, pins 27 and 28 for receiving data from a two-wire bus R, pins 21 and 22 respectively at potentials U2 and U1 for, according to the use made of the coupling system, a power supply source or a peripheral, such as the actuator 10 in FIG. 1, and pins 23 and 24 for respectively receiving data sent by a peripheral such as an actuator or a control unit or for sending data to such a peripheral.

As can be seen, the coupling system 200 in FIG. 3 comprises elements that are already present in the coupling system 200 of FIG. 2. These same elements therefore bear the same reference as in FIG. 2 and are not described again here.

A coupling system 200 according to a first embodiment of the invention therefore comprises two electrical couplers 20T and 20R.

The electrical coupler 20T in FIG. 3 differs from the one described in relation to FIG. 2 in that it comprises a band-rejection filter 90. This band-rejection filter 90 has a terminal that is connected to the common terminals of the windings 32 and 33 of the transformer 30 and the other terminal connected to the power supply line 22L carrying the potential U1. This filter 90 is designed to reject one or more frequency bands including the resonant frequency or frequencies F0 of the isolation transformer 70 and of the transformer 30. For example, according to a simple embodiment, the filter 90 consists of a wave-trap circuit that is formed by an inductor and a capacitor (in parallel as here or in series) and the resonant frequency F1 of which is equal to the main resonant frequency F0 of the isolation transformer 70 and of the transformer 30. At this frequency F1, the filter 90 has very high impedance, which has the effect of isolating the pin 22 carrying the potential U1 of the transformer 30, in particular from the common terminal between its windings 32 and 33.

Likewise, the electrical coupler 20R shown in FIG. 3 also comprises a band-rejection filter 100, a terminal of which is connected to the common terminal of the windings 52 and 53 of the transformer 50 and the other terminal of which is connected to the power supply line 21L carrying the potential U2. This filter 100 is designed to reject one or more frequency bands including the resonant frequency or frequencies F0 of the isolation transformer 80 and of the transformer 50. For example, according to a simple embodiment, the filter 100 is also formed by a wave-trap circuit that is formed by an inductor and a capacitor (in parallel or in series) and the resonant frequency F1 of which is equal to the main resonant frequency F0 of the isolation transformer 80 and of the transformer 50. The functioning of this filter 100 is identical to that of the filter 90.

The functioning is as follows. Among the high-frequency stray currents that would be present on the wires of the pairs of wires T and R, for example generated by lightning or injected during high-frequency tests, those that have a frequency close to the frequency or frequencies F0 of the isolation transformer 70 (or 80) and of the transformer 30 (or respectively 50) are of relatively high amplitude on the common terminal of the windings 32 and 33 (or respectively 52 and 53) because of the resonance at the transformers 70 (or 80) and 30 (or 50) but are rejected by the respective filters 90 and 100 and are therefore not found on the power supply lines 21L and 22L connected to the pins 21 and 22, which is protection for the peripherals connected to these pins 21 and 22.

In the embodiment shown in FIG. 4, each electrical coupler 20T and 20R also comprises a low-pass filter 110, 120 between said rejection filter 90, 100 and the power supply line 22L, 21L carrying the corresponding supply potential U1, U2. In an example embodiment, the low-pass filter 110 consists of a simple capacitor that is provided between the power supply line 22L carrying the potential U1 and the mechanical ground of the apparatus so as to minimise the high-frequency signals on this line 22L. Likewise, for the pathway corresponding to the two-wire bus R, the low-pass filter 120 consists of a capacitor provided between the power supply line 21L carrying the potential U2 and the mechanical ground of the apparatus so as also to minimise the high-frequency signals on this line 21L.

Each capacitor 110, 120, the impedance of which is low at very high frequency, forms a divider bridge with the corresponding rejection filter 100, 110, further minimising the high-frequency voltage, in particular at the resonant frequency F0 of the isolation transformer 70 and of the transformer 30, 50, at the terminal carrying the potential U1, U2.

The cutoff frequency of the low-pass filters 110, 120 is lower than the lowest resonant frequency resulting from the association of the isolation transformer 70, 80 and the transformer 30, 50 and higher than the frequency of the potentials U1 and U2 if these are alternating.

FIG. 5 shows a third embodiment of the invention. According to this embodiment, it differs from the one described in relation to FIG. 4 in that the transformer 30 of the electrical coupler 20T now comprises a fourth winding 34, the terminals of which are respectively connected to the first terminals and two identical windings 131 and 132 of a transformer 130, the second terminals of which are connected to the mechanical ground of the apparatus in which the electrical coupler in question is installed. The windings 131 and 132 are coupled magnetically and are wound in different directions (see symbolic dots relating to these windings). Likewise, the transformer 50 of the electrical coupler 20R comprises a fourth winding 54, the terminals of which are respectively connected to the first terminals of two identical windings 141 and 142 of a transformer 140, the second terminals of which are connected to the mechanical ground of the apparatus in which the electrical coupler in question is installed. The windings 141 and 142 are coupled magnetically and are wound in different directions (see symbolic dots relating to these windings).

The winding 34 forms a capacitive screen between the first winding 31 on the one hand and the second and third windings 32 and 33 on the other hand, which has the effect of substantially increasing the main resonant frequency F0 relating to the equivalent capacitances of the transformer 30. Moreover, among the high-frequency currents that will be present on the wires of the pair of wires T, for example caused by lightning or injected during high-frequency tests, those that have a resonant frequency F0 have high amplitude because of the resonance due to the isolation transformer 70 and to the transformer 30. They excite the winding 34, which switches them to the mechanical ground via the windings 131 and 132 of the transformer 130 which, in common mode, have low impedance. The amplifier 40 is thus protected against other voltages that may appear at the terminals of the winding 31 of the transformer 30. Outside these frequencies, the windings 131 and 132 have high impedance so that the winding 34 does not form a screen. The functioning of the amplifier 40 is then not disturbed by the presence of the winding 34.

Likewise, the winding 54 forms a capacitive screen between the first winding 51 on the one hand and the second and third windings 52 and 53 on the other hand, which has the effect of substantially increasing the main resonant frequency F0 relating to the equivalent capacitances of the transformer 50. In addition, among the high-frequency currents that will be present on the wires of the pair of wires R, for example caused by lightning or injected during high-frequency tests, those that have a resonant frequency F0 are of high amplitude because of the resonance due to the isolation transformer 80 and to the transformer 50. They excite the winding 54, which switches them to the mechanical ground via the windings 141 and 142 of the transformer 140 which, in common mode, have low impedance. Outside these frequencies, the windings 141 and 142 have high impedance so that the winding 54 does not form a screen.

The coupling systems that are the subjects of FIGS. 2 to 5 are designed for a power supply, via the supply potentials U1 and U2, both direct and low-frequency alternating (for example below 1 MHz, that is to say lower by several orders of magnitude than the frequency of the data signals (for example greater than 100 MHz). The embodiment in FIG. 6 provides an exclusively alternating supply mode. Compared with the embodiments in FIGS. 3 to 5, the embodiment in FIG. 6 comprises a galvanic isolation transformer 150, the primary winding 151 of which is connected to the pins 22 and 21 to which there is connected either a peripheral (not shown) in order to be supplied thereon, or a power supply source (not shown), and the winding 152 of which is connected to the power supply lines 22L and 21L, here the respective outputs of the filters 90 and 100. In the embodiment in FIG. 6, all the elements of the embodiment in FIG. 5 are present. However, it will be understood that this transformer 150 could also be connected similarly in the electrical couplers of the embodiments in FIGS. 3 and 4.

In addition, it should also be noted that the transformer 150 could be not included in the electrical coupler 200 and thus be mounted at a distance from this electrical coupler 200.

The electrical couplers 20T and 20R are described as forming part of the same coupling system, therefore comprising two electrical couplers, one 20T dedicated to the sending of data signals over the two-wire bus T, and the other 20R dedicated to the reception of data signals present on the two-wire bus R. The present invention relates to the electrical couplers as just described, when they are part of a coupling system or on the contrary isolated.

The invention claimed is:

1. A power and data electrical coupler of a type comprising:
   a transformer comprising a first winding which is designed to receive or deliver data signals and second and third windings which are magnetically coupled to each other and said first winding, the second and third windings are connected in series with each other with a common terminal connected to a power supply line,
   an isolation transformer comprising two identical windings magnetically coupled to each other,
   first terminals of said respective windings of said isolation transformer being directly connected to terminals of the second and third windings of said transformer and second terminals of said respective windings of said isolation transformer being connected to a two-wire bus,
   the windings of said transformers being such that said electrical coupler delivers to said two-wire bus or receives from said two-wire bus, in differential mode, data signals and, in common mode, the power supply potential of said power supply line, wherein first terminals connected to said second and third windings is connected to said power supply line by means of a band-rejection filter, said filter rejecting one or more frequency bands including a resonant frequency or frequencies resulting from an association of the isolation transformer and the transformer.

2. The electrical coupler according to claim 1, further comprising a low-pass filter between said band-rejection filter and said power supply line.

3. The electrical coupler according to claim 1, wherein said transformer comprises a fourth winding, the terminals of which are connected to the first terminals of two identical windings coupled magnetically and wound in directions different from another transformer, said two windings having their second terminals connected to a mechanical ground.

4. A coupling system, comprising two electrical couplers according to claim 1, the first of said electrical couplers being connected to a first two-wire bus in order to send thereon data delivered to said first coupler by a control unit and to raise it to or receive thereon a first supply potential, and the second of said couplers being connected to a second two-wire bus in order to receive data thereon and to raise it to or receive thereon a second supply potential, said data being delivered by said second coupler to a control unit.

5. The coupling system according to claim 4, further comprising a galvanic isolation transformer, the primary winding of which is connected either to a peripheral in order to be supplied thereon, or to a supply source, and the secondary winding of which is connected to the power supply lines of the respective electrical couplers.

6. A data and power-supply transport network designed, via two-wire buses, to couple electrical actuators to control units and to power supplies, wherein the data and power-supply transport network comprises:
   (1) a plurality of electrical couplers according to claim 1 or
   (2) a plurality of coupling systems, wherein each coupling system comprises:
      two electrical couplers according to claim 1, the first of said electrical couplers being connected to a first two-wire bus in order to send thereon data delivered to said first coupler by a control unit and to raise it to or receive thereon a first supply potential, and the second of said couplers being connected to a second two-wire bus in order to receive data thereon and to raise it to or receive thereon a second supply potential, said data being delivered by said second coupler to a control unit.

* * * * *